United States Patent [19]

Ishiyama et al.

[11] Patent Number: 5,640,403

[45] Date of Patent: Jun. 17, 1997

[54] FAULT DIAGNOSIS METHOD FOR A SEQUENTIAL CIRCUIT

[75] Inventors: Toshio Ishiyama; Donald Klein, both of Tokyo, Japan

[73] Assignee: NEC Corporation, Tokyo, Japan

[21] Appl. No.: 535,383

[22] Filed: Sep. 28, 1995

[30] Foreign Application Priority Data

Sep. 28, 1994 [JP] Japan .................................. 6-233353
Nov. 28, 1994 [JP] Japan .................................. 6-292866

[51] Int. Cl.$^6$ ............................ G01R 31/28; G06G 7/48; G05B 19/02
[52] U.S. Cl. ........................ 371/26; 364/578; 364/580
[58] Field of Search .......................... 371/26, 25.1, 22.3, 371/22.5; 395/183.09, 183.08; 364/578, 580, 264.3

[56] References Cited

U.S. PATENT DOCUMENTS

| | | | |
|---|---|---|---|
| 3,497,685 | 2/1970 | Stafford et al. | 371/26 |
| 3,715,573 | 2/1973 | Vogelsberg | 371/26 |
| 3,780,277 | 12/1973 | Armstrong et al. | 371/26 |
| 4,503,536 | 3/1985 | Panzer | 371/26 |
| 4,527,272 | 7/1985 | Rueiney | 371/26 |

OTHER PUBLICATIONS

T. Nakamura et al. "Novel Image-based LSI Diagnostic Method Using E-beam without CAD Database" IEEE, 1992, pp. 164–169.

B. Rogel–Favila et al. "Model–Based Fault Diagnosis of Sequential Circuits and its Acceleration" IEEE, 1991, pp. 224–229.

Primary Examiner—Robert W. Beausoliel, Jr.
Assistant Examiner—Trinh L. Tu
Attorney, Agent, or Firm—Foley & Lardner

[57] ABSTRACT

A fault diagnosis method for inferring a faulty position in an LSI includes the steps of testing the actual LSI to obtain pass/fail pin information, extracting a combinational circuit by tracing from one of a fail output pin, simulating the extracted combinational circuit using the expected outputs of flip flops located at input side of the combinational circuit as input test vectors, and inferring the faulty position by comparing the pass/fail information with the simulation results for expected values on each node in the combinational circuit for the input test vectors. The method is repeated if the faulty position is not inferred in the combinational circuit by extracting another combinational circuit preceding the combinational circuit.

6 Claims, 7 Drawing Sheets

FAULT DIAGNOSIS METHOD FOR A SEQUENTIAL CIRCUIT

BACKGROUND OF THE INVENTION (a) Field of the Invention

The present invention relates to a fault diagnosis method for a sequential circuit of an LSI and, more particularly, to a method for localizing a faulty position of a logic circuit by inferring.

(b) Description of the Related Art

A conventional method for localizing a faulty position of an LSI by inferring, as shown in FIG. 1, comprises step 19 of preparing a fault diagnosis dictionary (fault dictionary) using a fault diagnosis simulator (fault simulator), step 20 of obtaining failure information by actually testing an LSI, step 21 of looking up or retrieval of the fault dictionary based on the failure information indicating the results of the test, and step 22 of localizing a faulty position by inferring.

The fault simulator carries out a logic simulation for an LSI while assuming that the LSI includes a faulty position. The fault simulator compares the results of the logic simulation and the expected values of output pins to prepare a fault dictionary in which the assumed faulty position is stored in association with an input fail vector, which has exhibited the fault at the output pin or pins. The fault dictionary is looked up based on the failure information indicating the results of a test which is actually performed for an LSI, thereby enabling possible faulty positions to be inferred. A priority sequence may be assigned among the assumed faulty positions using a plurality of sets of fail/pass information for localizing a faulty position.

In the method as described above, the fault dictionary must be prepared in advance, during which fault simulations must be performed for a prolonged period of time to prepare the fault dictionary for practical use. Accordingly, the method has the problem in that the execution time for the fault simulation is extremely large and the number of data files for the fault dictionary becomes also large as the scale of integration of an LSI to be tested increases.

Further, since the fault model used in the fault simulation is generally designed for a single stacked fault neglecting a floating fail output, that is, single fault assuming "1" or "0" at the fail output, the model does not correctly represent an actual operation in the case of a multiple fault such as a bridge fault. If the model used in the fault simulation is upgraded to cope with such a multiple fault, the method will be impractical, because the execution time required for the fault simulation becomes excessively large.

Another method has been proposed in which the foregoing procedure is repeated in a hierarchical sequence to narrow the suspected area stepwise and which utilizes a procedure for observing the internal circuit of an LSI by an electron beam tester between the procedures so as to limit the suspected area. In this method, starting with a broad area for the procedure, a smaller faulty area assumption is carried out in each stage by limiting the precedent candidate faulty area using the electron beam tester between two of the stages so as to limit the area for the candidate faulty positions before a lower rank of the procedure.

The second method is effective, because the area for candidate fault positions is limited stepwise by observing the candidate fault area. However, this method has a problem in that the observation of an electric potential on an interconnection layer located near the bottom of a multi-level interconnection structure becomes difficult as the number of layers increases due to an increase in the scale of integration of the LSI.

SUMMARY OF THE INVENTION

In view of the foregoing, it is an object of the present invention to provide an improved method for inferring a fault position of an LSI, which can infer not only a single stacked fault but also other kinds of faults such as a multi-fault failure with a reduced execution time.

A method for inferring a faulty position of an LSI according to a preferred embodiment of the first aspect of the present invention includes the steps of: calculating by a logic simulation expected output values of flip flops in the LSI for possible input test vectors of the LSI; testing the LSI to obtain pass/fail pin information of output pins for the possible input test vectors of the LSI; extracting, based on the net list of the LSI and the pass/fail pin information, a combinational circuit having inputs connected to input pins or outputs of any flip flop and outputs connected to output pins or inputs of any flip flop, the combinational circuit including nets and logic elements other than any flip flop reached during tracing of the nets and the logic elements, wherein the tracing starts from a first fail output pin by backward tracing, the tracing includes forward tracing from an input pin or an output of any flip flop reached during backward tracing, and the tracing includes backward tracing from at least one fail output pin other than the first fail pin reached by tracing during extracting the combinational circuit; obtaining, by a logic simulation of the combinational circuit, expected values at each node of the extracted combinational circuit for possible input vectors for the combinational circuit based on the expected output values of the flip flop and possible input vectors; and inferring a faulty position by comparing the pass/fail pin information with the expected values at each node of the combinational circuit.

A method for inferring a faulty position according to a preferred embodiment of the second aspect of the present invention includes the steps of: testing the LSI to obtain pass/fail pin information of output pins for the possible input test vectors of the LSI; extracting a first combinational circuit having a plurality of inputs and a plurality of outputs, a first flip flop group of flip flops each having an output connected to one of the inputs of the first combinational circuit, and a second flip flop group of flip flops each having an input connected to one of the outputs of the combinational circuit by tracing along nets and through logic elements other than any flip flop, wherein the tracing starts from a first fail output pin or an inferred first fail input of the second flip group by backward tracing, the tracing includes forward tracing from an input pin or an output of any flip flop reached during backward tracing, and the tracing includes backward tracing from at least one fail output pin other than the first fail pin or at least one fail input of the second flip flop group other than the inferred first fail input of the second flip flop group reached by forward tracing during extracting the combinational circuit; extracting a second combinational circuit having inputs connected to outputs of the first flip flop group by forward tracing toward the output pins; obtaining suspected input fail vectors for the first combinational circuit based on the pass/fail pin information, the suspected fail vectors each providing through the first combinational circuit an output pattern coinciding with a part of a fail output pattern found in the pass/fail pin information; selecting input fail vectors for the first and second combinational circuits from among the suspected input fail vectors, by a logic simulation of the first and second combinational circuits based on the pass/fail pin information, the input fail vectors providing through the first and the second combinational circuits an output pattern coinciding with a part of a fail output pattern found in the pass/fail pin information; simulating the first combinational circuit by a first simulation using the input fail vectors and by a second simulation using normal input vectors for the first combinational circuit based on expected outputs of the first flip flop group; and inferring a faulty net in the first combinational circuit by comparing a signal of the first simulation and a corresponding signal of the second simulation in the first combinational circuit.

BRIEF DESCRIPTION OF THE DRAWINGS

The above and other objects, as well as features and advantages of the present invention will be more apparent from the following description considered with the accompanying drawings, in which.

DESCRIPTION OF THE PREFERRED EMBODIMENTS

Figure 1:
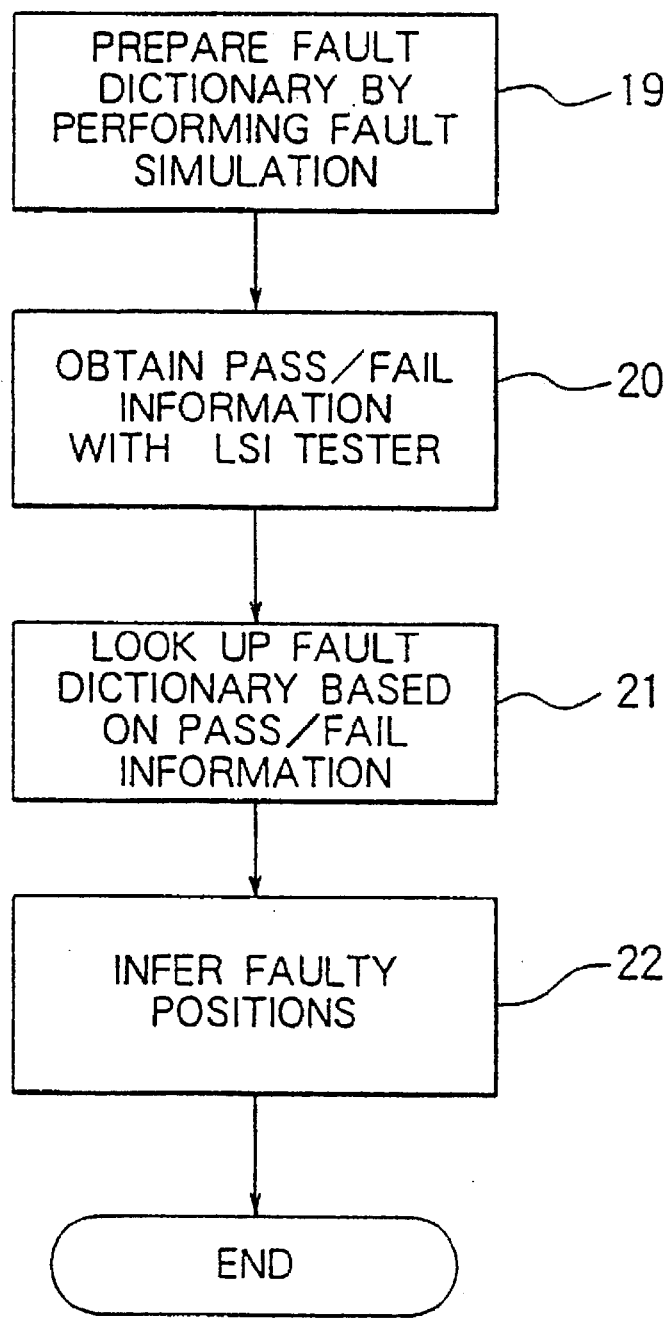
FIG. 1 is a flowchart showing a conventional method for localizing a faulty position of an LSI by inferring.
Figure 2:
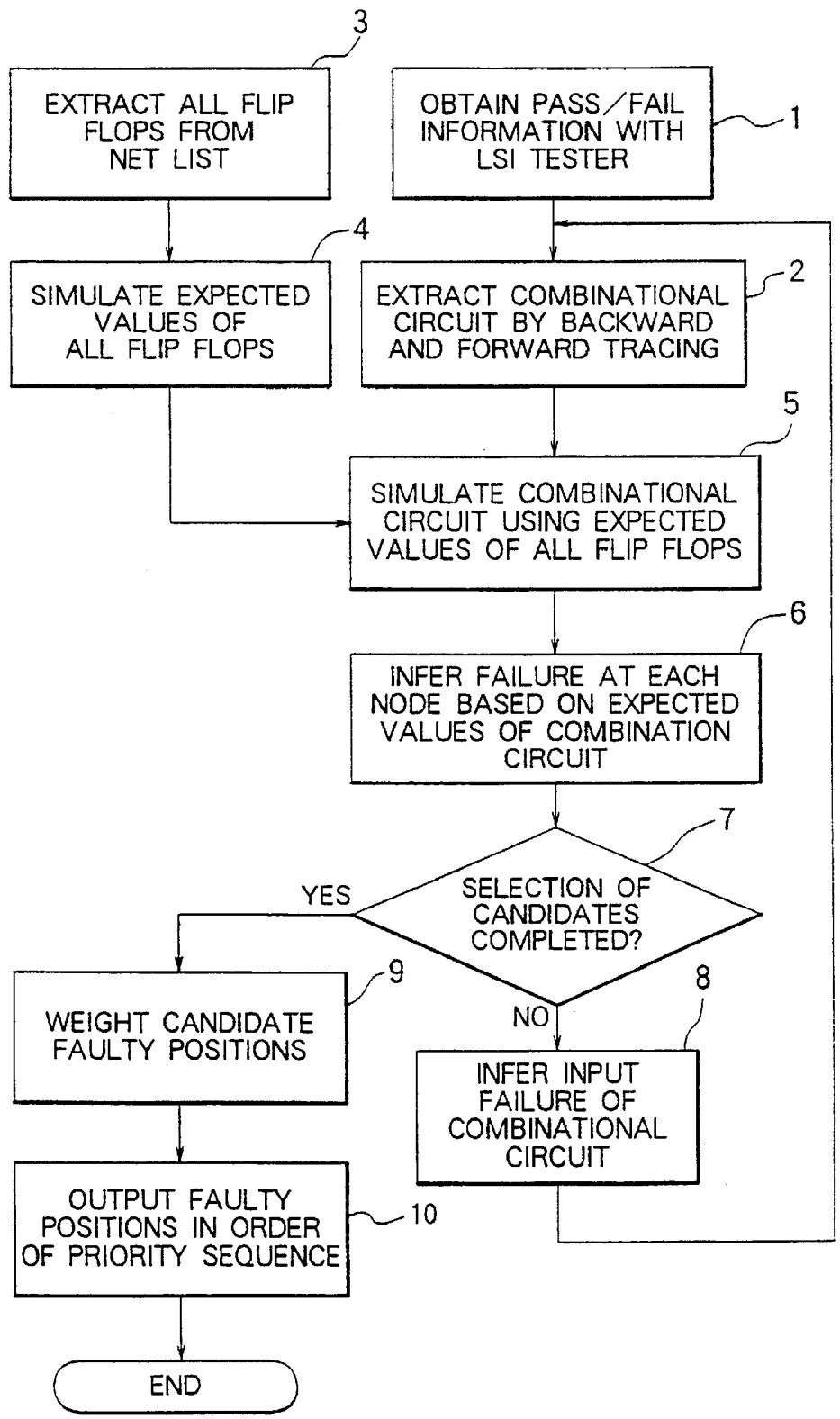
FIG. 2 is a flowchart showing a method for inferring a faulty position of an LSI according to a first embodiment of the present invention.

Embodiments of the present invention will now be described with reference to the accompanying drawings.
First Embodiment:

FIG. 2 shows a method according to a first embodiment of the present invention for fault diagnosis of an LSI. In step 1 of FIG. 2, the LSI is tested with an LSI tester to obtain complete pass/fail (pin) information of the output pins of the LSI. The pass/fail information includes pass/fail data indicating whether or not each of the output pins supplies an expected value as well as unmask/mask data whether or not each of the output pins is actually tested or not. The pass/fail information further includes the input fail vectors of the LSI which have generated the failure at the output pin or pins, which data are stored in association with the pass/fail data.

In step 2, backward tracing is carried out, along nets and through logical elements other than any flip flop in the LSI, from one of the fail pins (first fail pin), as obtained in step 1, based on the net list of the LSI toward the input side of the LSI. When a net traced by the tracing has a branch, backward and forward tracing is performed from the branch. If the backward tracing reaches an input pin or an output of any flip flop, then forward tracing is performed from the input pin or output of flip flop toward output side of the LSI. If the forward tracing reaches an output pin and if the reached output pins includes at least one fail pin other than the first fail pin, then backward tracing is further performed similarly to the procedure as described for the first fail pin. If the reached output pins do not include another fail pin, the backward and forward tracing is finished to extract an objective combinational circuit including the traced net and passed logic elements.

In the procedure as described above, the combinational circuit is extracted, as a part of the LSI, having a plurality of inputs connected to input pins or outputs of any flip flops and a plurality of outputs connected to output pins or inputs of any flip flops.

On the other hand, in step 3, all flip flops contained in the net list of the LSI are extracted. In step 4, a logic simulation is carried out to obtain possible expected output values of all the flip flops for all of the possible input test vectors for the LSI, namely, for all of the possible combinations of the input pattern.

In step 5, for the combinational circuit obtained in step 2, which is considered to propagate a failure, a logic simulation is performed using the expected values of the flip flops to obtain all expected values at each node in the combinational circuit for all possible input vectors for the combinational circuit.

In step 6, whether a failure is present at each node in the combinational circuit or not is estimated based on the expected value at the each node, which has been obtained in step 5, and on the pass/fail information as obtained in step 1. The failure elements or nets can be inferred by limiting the area for or number of candidate faulty positions by repeating the procedure as described above. If there is no fail node for all possible input vectors for the combinational circuit, the combinational circuit is considered to be correct and inputs of the flip flops at the input side of the combinational circuit are suspected to have a faulty position.

Figure 3:
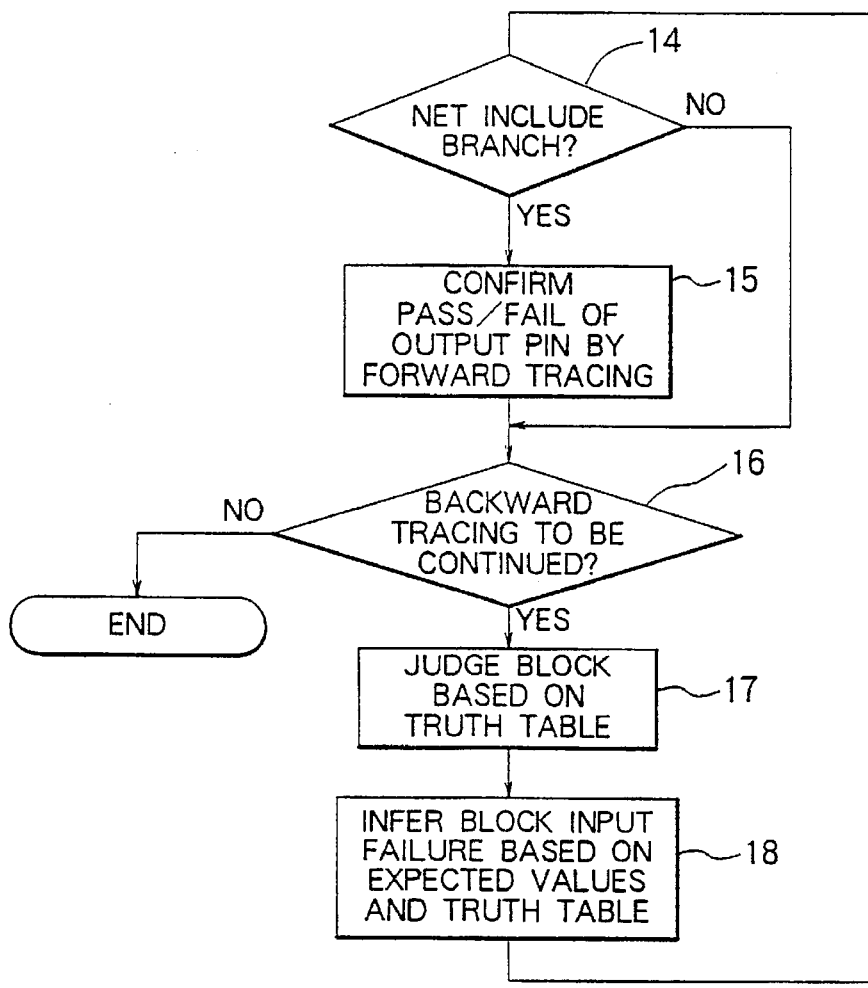
FIG. 3 is a flowchart showing the procedure in step 6 of the flowchart shown in FIG. 2.

Here, step 6 will be described in more detail with reference to the flowchart shown in FIG. 3 and a block diagram shown in FIG. 4.

Figure 4:
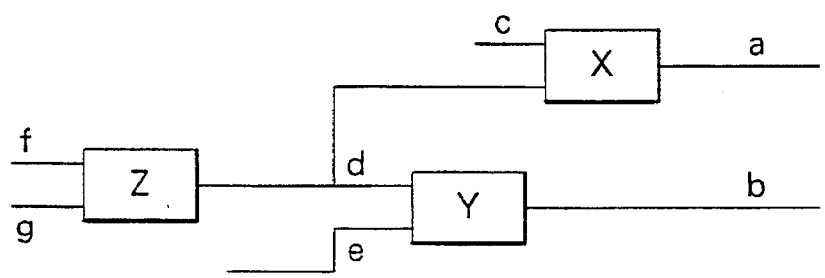
FIG. 4 is a block diagram exemplifying a part of the combinational circuit.

Referring to FIG. 4 which shows a part of the combinational circuit, reference symbols X, Y and Z represent logic blocks or elements in the combinational circuit, and reference symbols "a" to "g" represents nets. It is assumed that a failure has occurred at net "b". In step 14 of the flowchart, it is judged whether or not net "b" has a branch. Since net "b" does not have a branch, the process moves to step 16, in which it is judged whether or not backward tracing is to be continued. Unless the backward tracing reaches an input pin or an output of a flip flop, or it is judged in step 15 that the net is normal, the backward tracing is continued. Accordingly, the backward tracing at net "b" reaches the block Y.

In step 17, expected values for nets "d", "e" and "b" are compared with the pass/fail information of the output net "b" using a truth table of block Y to judge whether or not block Y is faulty. In step 18, the input of block Y from which a failure propagates is judged as to whether it has a failure by using the truth table of block Y, the expected values of nets "d", "e" and "b", and the inferred fail value of net "b". If it is assumed that a failure of net "d" is suspected, the process operates for judging whether or not net "d" has a branch in step 14. Since net "d" has a branch, the process moves to step 15.

In step 15, successive forward tracing is performed at net "d", at block X and then at net "a". This forward tracing is repeated until the tracing reaches an output pin or an input of a flip flop. Subsequently, the pass/fail information of the output pin or inferred pass/fail information of the flip flop is compared with the result of the judgement at the starting point of the backward tracing at net "b" so as to judge whether the failure occurs at the upstream side of the branching point of net "d" or at the input side of block Y located at the downstream side of the branching point. If it is judged in step 16 that a failure occurs at the downstream side of the branching point of net "d" and that the output of block Z is therefore normal, the backward tracing is ended. Otherwise, if it is judged that a failure occurs at the upstream side of the branching point of net "d", the backward tracing is continued, and it is judged in step 17 whether or not block Z operates properly.

After inferring a candidate faulty position in the combinational circuit in step 6, it is judged in step 7 of FIG. 2 whether or not the selection of candidates has been completed. When the tracing has reached an output of any flip flop without detecting a failure, it means that the selection of candidates has not been completed. In this case, the process moves to step 8, in which input fails of the combinational circuit are inferred, i.e., failures of the flip flops or input side of the flip flops are inferred. After that, the process further moves back to step 2, in which backward tracing is again performed from the flip flop through which a failure is propagating. Also, forward tracing is performed from a branching point, if any.

When the backward tracing comes to an end in step 6 by inferring a candidate faulty position, it is judged in step 7 whether or not the selection of candidates has been completed. If the selection has been completed, the process moves to step 9, in which weights are given to all the candidate faulty positions obtained up to the present. In step 10, a list is output on which the candidate faulty positions are listed in the order of the priority sequence which is determined based on the weights given to them.

Figure 5:
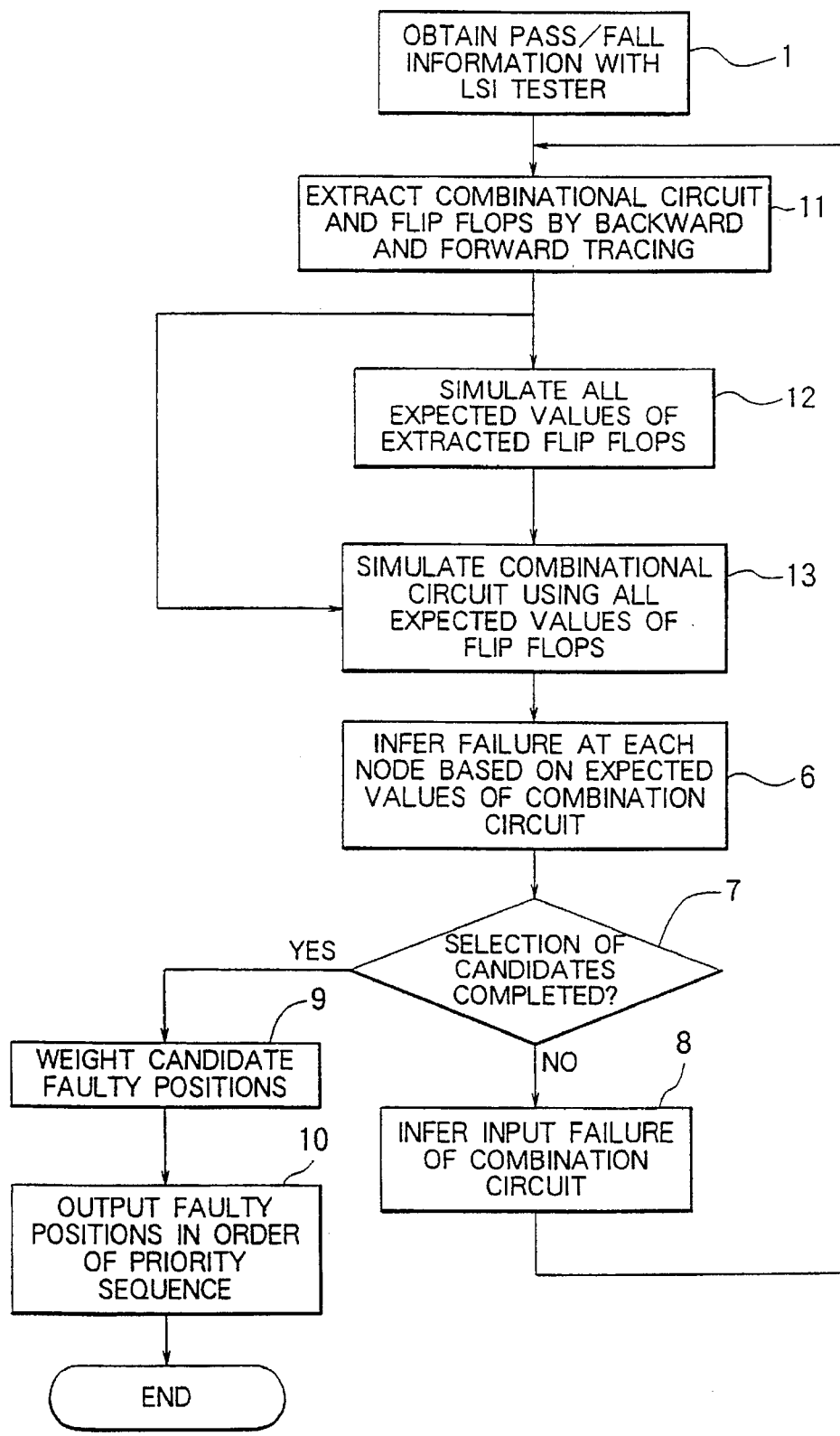
FIG. 5 is a flowchart showing a method for inferring a faulty position of an LSI according to a second embodiment of the present invention.

Second Embodiment:

A second embodiment of the present invention will be described with reference to FIG. 5.

As in the first embodiment shown in FIG. 2, an LSI is tested with an LSI tester in step 1, to obtain complete pass/fail information for output pins of the LSI for possible input test vectors. In step 11, backward tracing is carried out along nets and through logic elements from one of the fail pins (first pin) based on a net list. When the net has a branch, forward tracing are additionally performed, similarly to the first embodiment.

If the backward tracing reaches an input pin or an output of any flip flop, then forward tracing is performed from the reached input pin or the output of flip flop toward output pins. If the reached output pins do not include a fail pin other than the first fail pin, the backward and forward tracing is completed to extract a combinational circuit and any flip flops at the input side or the output side of the combinational circuit. If the reached output pins includes a new fail pin other than the first fail pin, an additional backward and forward tracing is executed from the new fail pin. If the new backward and forward tracing does not reach a new output fail pin, the tracing process is completed to extract a combinational circuit and flip flop groups at the input side and output side of the combinational circuit.

If the process as described above does not find a candidate faulty position in subsequent procedure, the backward and forward tracing is repeated from the inputs of the flip flop group to extract a new combinational circuit. The combinational circuit thus extracted has a plurality of inputs and outputs, wherein input pins or outputs of flip flops at the inputs side of the combinational circuit are connected to the inputs of the combinational circuit and output pins or inputs of flip flops at the output side are connected to the outputs of the combinational circuit.

In step 12, a logic simulation of the extracted flip flops of the first and second input flip flop group is carried out to obtain all expected output values of the flip flops, for all input test vectors of the LSI. In step 13, for the combinational circuit obtained in step 11 which is a part of the LSI and considered to propagate a failure, a logic simulation is performed using the expected output values of the flip flops obtained in step 12 to obtain expected values at each node in the combinational circuit for all possible input vectors for the combinational circuit. The following steps 6 to 10 are similar to the steps 6 to 10 in the first embodiment, respectively.

In step 6, presence or absence of a failure at each node is judged based on the expected value at the each node of the combinational circuit, which has been obtained in step 13, and on the pass/fail information obtained in step 1. This procedure can be repeated to narrow the candidate faulty area or select the candidate faulty positions.

In step 7, it is judged whether or not the selection of candidate faulty positions has been completed. When the backward tracing has reached an output of a flip flop during the selection of candidates in step 6 without detecting a failure, it means that the selection of candidates has not been completed. In this case, the process moves to step 8, in which input failures of the combinational circuit are inferred, i.e., failures of the flip flops in the input flip flop group are suspected. After that, the process moves back to step 11, in which a new backward tracing is again performed from the flip flop in the first flip flop group to which a failure propagates, with the inputs of the flip flops being respective starting points of the backward tracing. Also, forward tracing is additionally performed from a branch, if any.

When the backward tracing comes to an end in step 13, it is judged in step 7 whether or not the selection of candidates has been completed. If the selection has been completed, the process moves to step 9, in which weights are given to all the candidate faulty positions obtained up to the present. In step 10, a list is output on which the candidate faulty positions are listed in the order of the priority sequence which is determined based on the weights given to them.

As described above, in the methods according to the first and second embodiments, a partial combinational circuit, which occupies a small area in the LSI and has inferred faulty positions, is extracted by backward tracing and forward tracing. A logic simulation of the partial combinational circuit is then performed using the expected values of the flip flops, and backward tracing can be performed using the result of the simulation to infer a faulty position. Accordingly, it is unnecessary to prepare a fault dictionary by operation of a fault simulation and store the fault dictionary. As a result, the execution time can be remarkably reduced. These advantages become more remarkable when the number of nodes increases due to an increase in the scale of integration of an LSI. Moreover, a candidate faulty position can be found even when the fault is not a single stacked fault.

Further, even when an LSI to be tested has a multi-level interconnection structure, the above methods can detect an inferred faulty position without an electron beam tester, and are therefore superior to the conventional method using an electron beam tester in which the observation becomes difficult as the number of layers increases.

Third Embodiment:

A third embodiment of the present invention will be described with reference to FIG. 6–FIG. 9.

Figure 6:
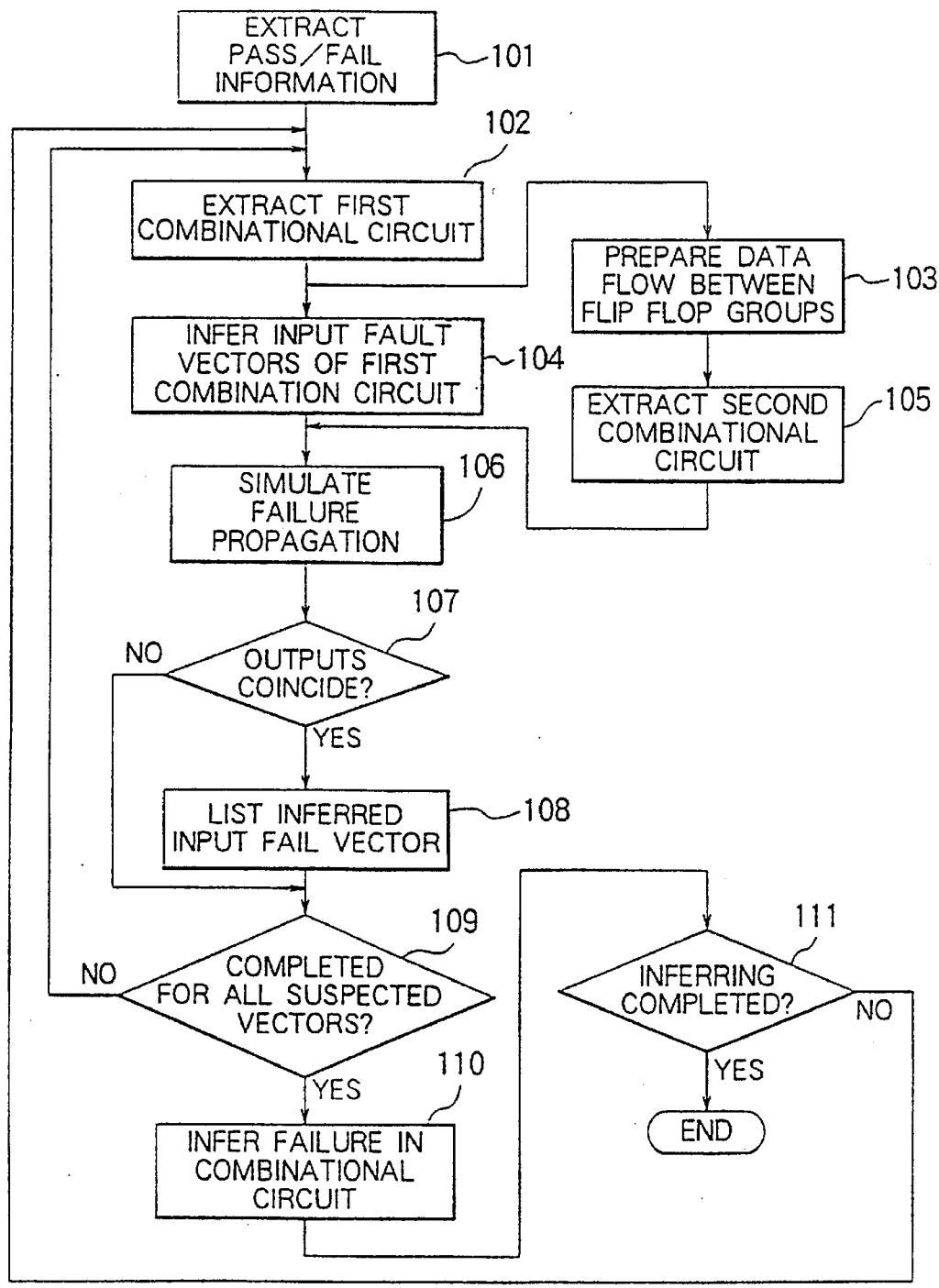
FIG. 6 is a flowchart showing a method for inferring a faulty position of an LSI according to a third embodiment of the present invention.
Figure 7:
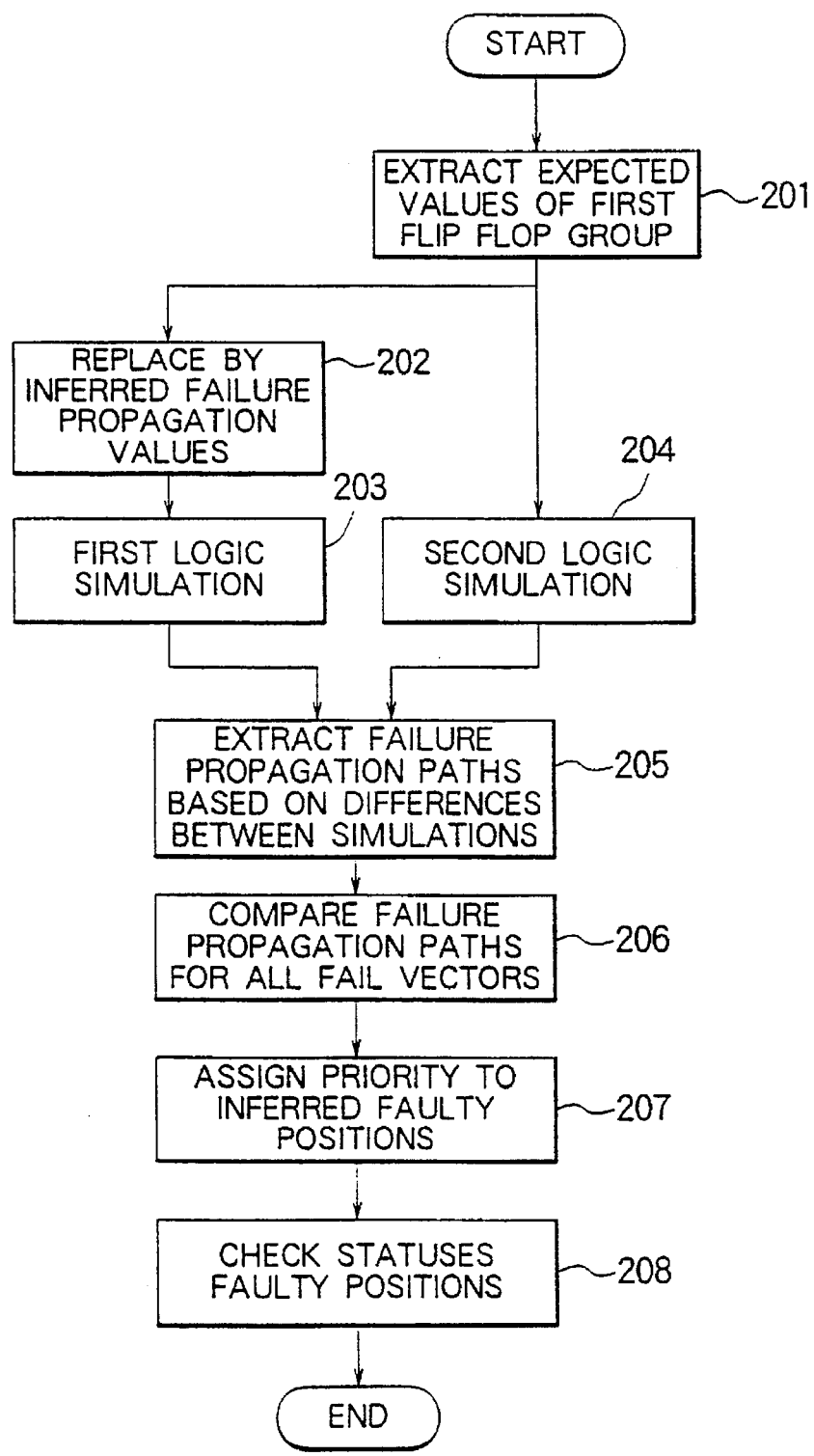
FIG. 7 is a flowchart showing the procedure in step 110 of the flowchart shown in FIG. 6.
Figure 8:
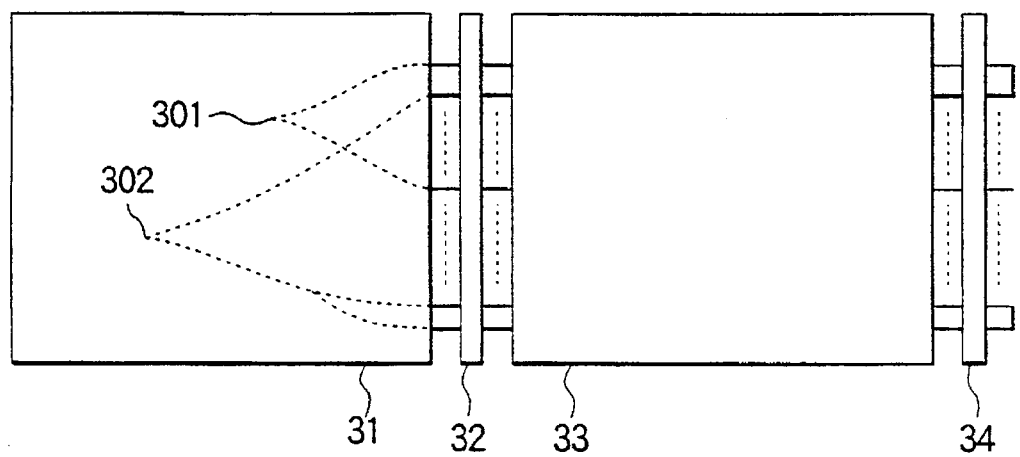
FIG. 8 is a block diagram for explaining the operation for confirming branches of signal lines in a precedent combinational circuit when a multiple fault propagation is assumed in the third embodiment.
Figure 9:
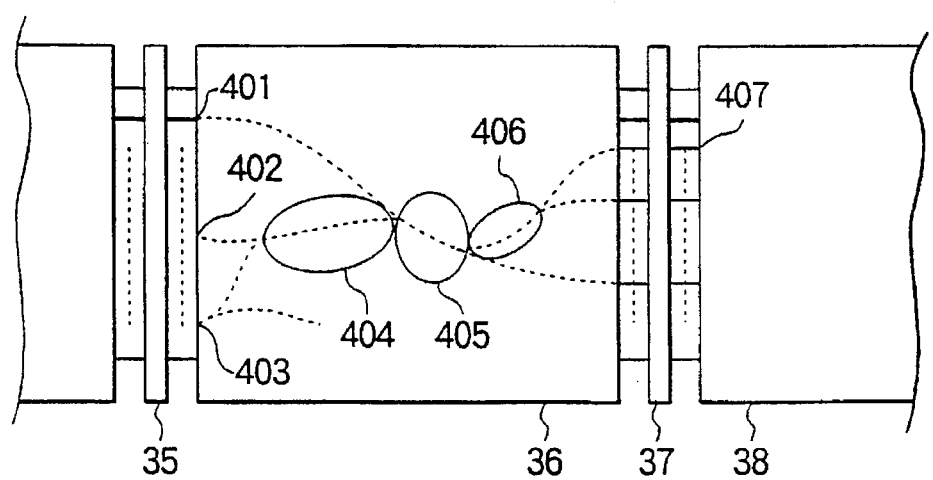
FIG. 9 is another block diagram for explaining the operation for extracting overlapped areas by comparing fault propagation paths for input fail vectors when faulty positions are inferred within a combinational circuit in the third embodiment.

FIG. 6 is a flowchart showing a procedure for obtaining input fail vectors providing a fail output pattern found in pass/fail pin information and to be input to a combinational circuit by a simulation. FIG. 7 shows the procedure, which corresponds to step 110 in FIG. 6, for obtaining a candidate faulty position in the combinational circuit. FIG. 8 shows an example of an operation for inferring faulty branches of signal lines in a precedent combinational circuit when a multiple fault propagation is assumed. FIG. 9 shows an example of the operation for extracting overlapped paths by comparing fault propagation paths in a combinational circuit for all input fail vectors when a candidate faulty position is obtained within the combinational circuit.

The procedure of the present embodiment is performed in the processing steps for inferring a failure propagation from a first flip flop group located at the input side of the combinational circuit to a second flip flop group located at the output side of the combinational circuit.

In FIG. 6, the pass/fail information S1, expected values S2 of all flip flops, and net information S3 of whole the circuitry are read out from stored files in step 101. In subsequent step 102, backward tracing is performed from one of the fail output pins or inferred fail input of a flip flop for extraction of a first combinational circuit based on the pass/fail information S1 and on the net information S3 of the whole circuitry. Extraction of the first combinational circuit is first performed until reaching an input pin or any flip flop output in the LSI. Subsequently, forward tracing is performed from the reached input pin or output of the flip flop toward the outputs of the LSI. The extraction of a candidate first combinational circuit is continued until reaching an output pin or any flip flop input.

If the output pins of the candidate first combinational circuit include another fail pin other than the first fail pin or another fail input other than the first fail input of the flip flop, the circuit extraction in the backward and forward directions is performed for the another fail pin or fail input similarly to the search for the first fail pin or first fail input. This operation is repeated until it is impossible to find a new fail pin or new inferred fail input to thereby obtain an objective combinational circuit, from which the net information S4 of the combinational circuit is obtained based on the net list of the LSI.

After the processing for step 102 for extraction of the first combinational circuit, steps 103 and 104 are further performed. In step 103, by referring to the net information S3 for whole the circuitry, data flow information relating the data flow from the output of a first flip flop group 32 located at the input side of the combinational circuit 33 to the output pins or the inputs of a second flip flop group 34 located at the output side of the combinational circuit, as shown in FIG. 8, is prepared for all possible input vector. In subsequent step 105, a second combinational circuit, not shown in FIG. 8, is extracted by forward tracing from the other outputs of the first flip flop group 32 toward the outputs of the LSI. The second combinational circuit is located between the first outputs of the flip flop group 32 and a third flip flop group or output pins.

After step 102, suspected input fail vectors for the first combinational circuit are extracted based on the pass/fail information, net list for the first combinational circuit in step 104. The suspected input fail vectors may include an input pattern which is not obtained by the expected output values of the first flip flop group responding the possible input vectors.

Thereafter, it is judged, by simulation of the first and second combinational circuits, for each of the suspected input fail vectors whether or not each of the suspected input fail vectors provides an output pattern coinciding with a part of the fail output pattern listed in the pass/fail information which is transmitted by the first and second combinational circuits. Thus, inferred input fail vectors providing the output patterns coinciding with the pass/fail information with respect to the first and second combinational circuits are inferred. In the present embodiment, the inferred input fail vectors include both a single failure propagation and a multiple failure propagation at each input pin of the combinational circuit.

In the case of the multiple failure propagation, which is schematically shown in FIG. 8, another combinational circuit 31 in the preceding stage is investigated. That is, signal lines at input side of the first flip flop group 32 are traced backward from one of the inferred fail inputs of the combinational circuit 33 along failure propagation paths indicated by broken lines to extract terminal points 301 and 302 in a precedent combinational circuit to which nets propagating the failure are connected.

Subsequently, paths connected to the terminal points 301 and 302 are traced to extract a set of failure propagation signal lines which are branched from a common signal line and which are connected to inputs of the flip flop group 32. Next, a normal logic simulation is performed using the expected value S2 of all the flip flops and the combinational circuit 31 in the preceding stage to remove signal paths which are not then sensitizing from the combinational circuit 31. Moreover, clock signal lines for the first flip flop group 32 are checked to remove clock signal lines which are not enabled at that time.

In the step 106 of FIG. 6, a simulation for simulating the operation in the forward direction is performed by using the input fail vectors obtained in step 104 to input the same to the first and second combinational circuits. In step 107, the results in the outputs of the simulation performed in step 106 are compared with the pass/fail information, and it is judged whether each of the output patterns coincides with the one listed in the pass/fail information. The input fail vectors providing the failure output patterns listed in the pass/fail information are selected and stored in a file in step 108 as inferred output information of the first flip flop group 32.

One of the input fail vectors providing an output pattern which is not found in the pass/fail information is discarded by assuming that the inferred values obtained in step 104 are not correct. The process then moves to step 109 in which the next one of the suspected input fail vectors is investigated similarly. When it is judged in step 109 that the inferring process has not been performed for all the input fail vectors, the processing moves back to step 102 to repeat step 102 and steps following thereto. When it is judged in step 109 that the inferring process has been performed for all the suspected input fail vectors, the process moves to step 110, in which failures in the combinational circuit 33 are investigated. The detailed procedure of step 110 is shown in FIG. 7, which will be described later.

After the process of step 110 is completed, the process moves to step 111, in which it is judged whether the process for inferring a faulty position has been performed for the extracted combinational circuit. When the inferring cannot be performed for obtaining inferred faulty positions, the process moves back to step 102 to repeat the procedures in step 102 for extraction of precedent combinational circuit and steps following thereto.

Next, the procedure of step 110 will be described in detail with reference to FIG. 7. In step 201, expected output values S6 of the first flip flop group 32 at the input side of the combinational circuit 33 are extracted using the expected value information S5 of flip flops. In step 202, the expected values S6 of the first flip flop group 32 are replaced by the inferred input fail vector file S7 for the flip flop group 32 as obtained in step 108, and then read out. In step 203, a first logic simulation is performed using the inferred input fail vector file S7 for the flip flop group 32.

In step 204, a second and normal logic simulation is performed using the net information S4 of the combinational circuit 33 and the expected values S6 of the flip flop group 32. In subsequent step 205, statuses of the respective signal lines in the combinational circuit 33 are compared with each other using the results of the procedure in steps 203 and 204, so that a failure propagation path in the combinational circuit 33 is extracted based on the difference therebetween. In next step 206, the failure propagation paths for all the input fail vectors obtained in step 205 are compared with each other to extract overlapped circuit portions.

In FIG. 9, the signal lines 401, 402 and 403 from the outputs of the first flip flop group 35 run in the combinational circuit 36 as failure propagation paths, which are connected to output lines of the combinational circuit 36. These paths are illustrated by broken lines in FIG. 9. FIG. 9 shows areas 404, 405 and 406 in which overlapped portions of the failure propagation paths run. The area 404 includes an overlapped path of inferred failure signal lines 402 and 403, the area 406 includes an overlapped path of the failure propagation signal lines 401 and 402, and the area 405 includes an overlapped path of the failure propagation signal lines 401, 402 and 403. The failures are not determined whether they are generated in the combinational circuit or propagated from the precedent stage of the combinational circuit from the output pattern of the combinational circuit 36.

In step 207, a priority sequence is assigned to the detected candidate faulty positions based on the results indicating the frequency of the overlapping obtained in step 206. In step 208, the areas to which the priority has been assigned are obtained based on the results of the simulation, and it is checked whether each area is stacked to "0" or "1" for all the input fail vectors. Thereafter, the processing moves to step 111 (shown in FIG. 6)

As described above, in the method according to the third embodiment, since the first and second combinational circuits are extracted by backward and forward tracing from a fail pin, and an input fail vector is assigned to each of the output failure pattern of the output from the first and the second combinational circuits, the number of inferred input fail vectors to be simulated is extracted for failure investigation. Accordingly, the execution time for failure simulation can be reduced.

Also, when a failure propagation path is extracted in a combinational circuit, the failure propagation path can be extracted only by the comparison between the result of the first simulation the first combinational circuit using inferred input fail vectors and the second simulation which simulates a normal operation. Accordingly, the execution time required for the simulation for localizing the failure path can be reduced. In addition, a failure propagation path can be extracted even for a re-conversing circuit in a combinational circuit.

Moreover, in the method according to the present embodiment, since input fail vectors for the first combinational circuit are selected at the input boundary of the first combinational circuit, the inferred failure propagation path can be traced back to the precedent stage of the first combinational circuit. Accordingly, even when a multi-fault failure such as bridge-fault failure occurs, it is possible to infer both failure propagation paths which are independent of each other and failure propagation paths which are mutually affected. The method of the present embodiment therefore has the advantage in that errors hardly occur during the inferring of the fault propagation path.

Since above embodiments are described only for examples, the present invention is not limited to such embodiments and it will be obvious for those skilled in the art that various modifications or alterations can be easily made based on the above embodiments within the scope of the present invention.

What is claimed is:

1. A method for inferring a faulty position of an LSI including the steps of:

calculating, by a first logic simulation, expected output values of flip flops in the LSI for possible input test vectors of the LSI:

testing the LSI to obtain pass/fail pin information of output pins for the possible input test vectors of the LSI;

extracting, based on a list of nets of the LSI and the pass/fail pin information, a combinational circuit having a plurality of inputs each connected to an input pin or output of any flip flop and a plurality of outputs each connected to an output pin or input of any flip flop, the combinational circuit including nets and logic elements other than a flip flop, wherein tracing starts from a first fail output pin by backward tracing, the tracing includes forward tracing from an input pin or an output of any flip flop found during backward tracing, and the tracing includes tracing from at least one fail output pin other than the first fail pin found by tracing during extracting the combinational circuit:

obtaining, by a second logic simulation of the combinational circuit, expected values at each node of the combinational circuit for possible input vectors for the combinational circuit based on the expected output values of the flip flop and possible input vectors of the LSI; and inferring a faulty position by comparing the pass/fail pin information with the expected values at each node of the combinational circuit.

2. A method for inferring a faulty position of an LSI as defined in claim 1 further including the steps of:

extracting based on the net list of the LSI, another combinational circuit having a plurality of inputs each connected to an input pin or output of any flip flop and a plurality of outputs each connected to an output pin or input of any flip flop, the another combinational circuit including nets and logic elements other than a flip flop, wherein tracing starts from a flip flop having an inferred fail output connected to the another combinational circuit by backward tracing, the tracing includes forward tracing from an input pin or an output of any flip flop found during backward tracing, and the tracing includes tracing from at least one fail output pin other than the first fail pin found by tracing during extracting the another combinational circuit.

3. A method for inferring a faulty position of an LSI as defined in claim 1 further including the step of weighting inferred positions in a priority sequence.

4. A method for inferring a faulty position of an LSI as defined in claim 1 wherein said comparing includes backward tracing and forward tracing from a branch found during the tracing.

5. A method for inferring a faulty position of an LSI including the steps of:

> testing the LSI to obtain pass/fail pin information of output pins for possible input test vectors of the LSI:
>
> extracting a first combinational circuit having a plurality of inputs and a plurality of outputs, a first flip flop group of flip flops each having an output connected to one of the inputs of the first combinational circuit, and a second flip flop group of flip flops each having an input connected to one of the outputs of the combinational circuit by tracing along nets and through logic elements other than any flip flop in the LSI, wherein the tracing starts from a first fail output pin or an inferred first fail input of the second flip group by backward tracing, the tracing includes forward tracing from an input pin or an output of any flip flop found during backward tracing, and the tracing includes backward tracing from at least one inferred fail output pin other than the first fail pin or at least one fail input of the second flip flop group other than the inferred first fail input of the second flip flop group found by forward tracing during extracting the combinational circuit;
>
> extracting a second combinational circuit having inputs connected to outputs of the first flip flop group by forward tracing toward output pins;
>
> obtaining suspected input fail vectors for the first combinational circuit based on the pass/fail pin information and a net list, the suspected fail vectors each providing through the first combinational circuit an output pattern coinciding with a part of a fail output pattern found in the pass/fail pin information;
>
> selecting input fail vectors for the first and second combinational circuits from among the suspected input fail vectors, by a logic simulation of the first and second combinational circuits based on the pass/fail pin information, the input fail vectors providing through the first and the second combinational circuits an output pattern coinciding with a part of a fail output pattern found in the pass/fail pin information;
>
> simulating the first combinational circuit by a first simulation using the input fail vectors and by a second simulation using normal input vectors for the first combinational circuit based on expected outputs of the first flip flop group;
>
> inferring a faulty net in the first combinational circuit by comparing a signal of the first simulation and a corresponding signal of the second simulation in the first combinational circuit.

6. A method for inferring a faulty position of an LSI as defined in claim 5 wherein said inferring of the faulty net includes the steps of: counting frequency of each of inferred failure propagation paths in the first combinational circuit for the input fail vectors, and providing each of the inferred failure propagation paths with weight to assign a priority sequence to the inferred failure propagation paths.

* * * * *